United States Patent [19]

Grindheim

[11] 4,153,873
[45] May 8, 1979

[54] TRANSDUCER FOR CONVERTING A VARYING ANALOG CURRENT SIGNAL TO A BINARY DIGITAL SIGNAL

[75] Inventor: Earl A. Grindheim, Minneapolis, Minn.

[73] Assignee: Rosemount Inc., Eden Prairie, Minn.

[21] Appl. No.: 840,653

[22] Filed: Oct. 11, 1977

[51] Int. Cl.² .......................................... G01R 27/26
[52] U.S. Cl. ............................... 324/60 R; 324/61 R; 73/37; 361/283
[58] Field of Search ............. 324/60 R, 60 C, 60 CD, 324/61 R; 361/283; 73/37, 88.5 R

[56] References Cited

U.S. PATENT DOCUMENTS

| 2,371,395 | 3/1945 | Keeling, Jr. | 324/60 C |
| 3,325,727 | 6/1967 | Haas | 324/60 C |
| 3,497,801 | 2/1970 | Clower et al. | 324/60 R |
| 4,001,813 | 1/1977 | Kosakowski | 324/60 C |

Primary Examiner—Stanley T. Krawczewicz
Attorney, Agent, or Firm—Nickolas E. Westman

[57] ABSTRACT

A digital output capacitive transducer wherein two capacitors are used, one providing a reference current and the other providing a varying signal current. The signal current is obtained from an oscillator through a capacitor, which varies in capacitance as a function of the parameter to be measured. The reference current offsets the signal current to attain a known relationship between the sampled parameter and the signal current. The circuit has a small number of components and operates on a relatively low voltage with an accurate digital output.

14 Claims, 3 Drawing Figures

TRANSDUCER FOR CONVERTING A VARYING ANALOG CURRENT SIGNAL TO A BINARY DIGITAL SIGNAL

BACKGROUND OF THE INVENTION

1. Field of the Invention

This invention relates to a transducer providing a digital output signal which varies as a function of a parameter.

2. Description of the Prior Art

A capacitive sensor circuit wherein the capacitor value, representative of the sensed parameter, is sensed by a repeated transfer of quantities of known charge is shown in U.S. Pat. No. 4,039,940 issued Aug. 2, 1977. In this particular patent, the value of the capacitor is not represented in ditital form, however.

A prior art capacitive pressure transducer used to measure turbine compressor discharge pressure is described in a technical paper published by The American Society of Mechanical Engineers, Gas Turbine Division, United Engineering Center, 325 East 47th Street, New York, New York 10017, and entitled "A Pressure Transducer For An Electronic Field Control" their No. 73-GT-40. The publication teaches use of an oscillator for exciting a variable capacitor and a reference capacitor.

Additionally, a pressure transducer for a fuel control system employing a free running oscillator which impressed an AC voltage on a single variable capacitor was offered for sale by the assignee of the present application, more than one year ago. The operation of the free running oscillator of the device offered for sale was similar to that described in the ASME article.

SUMMARY OF THE INVENTION

This invention comprises a circuit for accurately providing a digital output in proportion to a measured variable electrical quantity, as shown capacitance. The circuit comprises an oscillator, a transformer and rectification means in circuit with a fixed and a varying capacitor which provides a DC signal as a function of the capacitance of the fixed capacitance and a DC signal as a function of the variable capacitor, which DC signals are converted to a binary digital output representative of the sensed parameter, as shown pressure.

The invention is particularly suited for measurement with a capacitive pressure sensor where one active capacitor and one reference capacitor are employed and where the binary digital output is zeroed and linear with the sensed parameter being measured.

DESCRIPTION OF THE PREFERRED EMBODIMENT

Figure 1A:
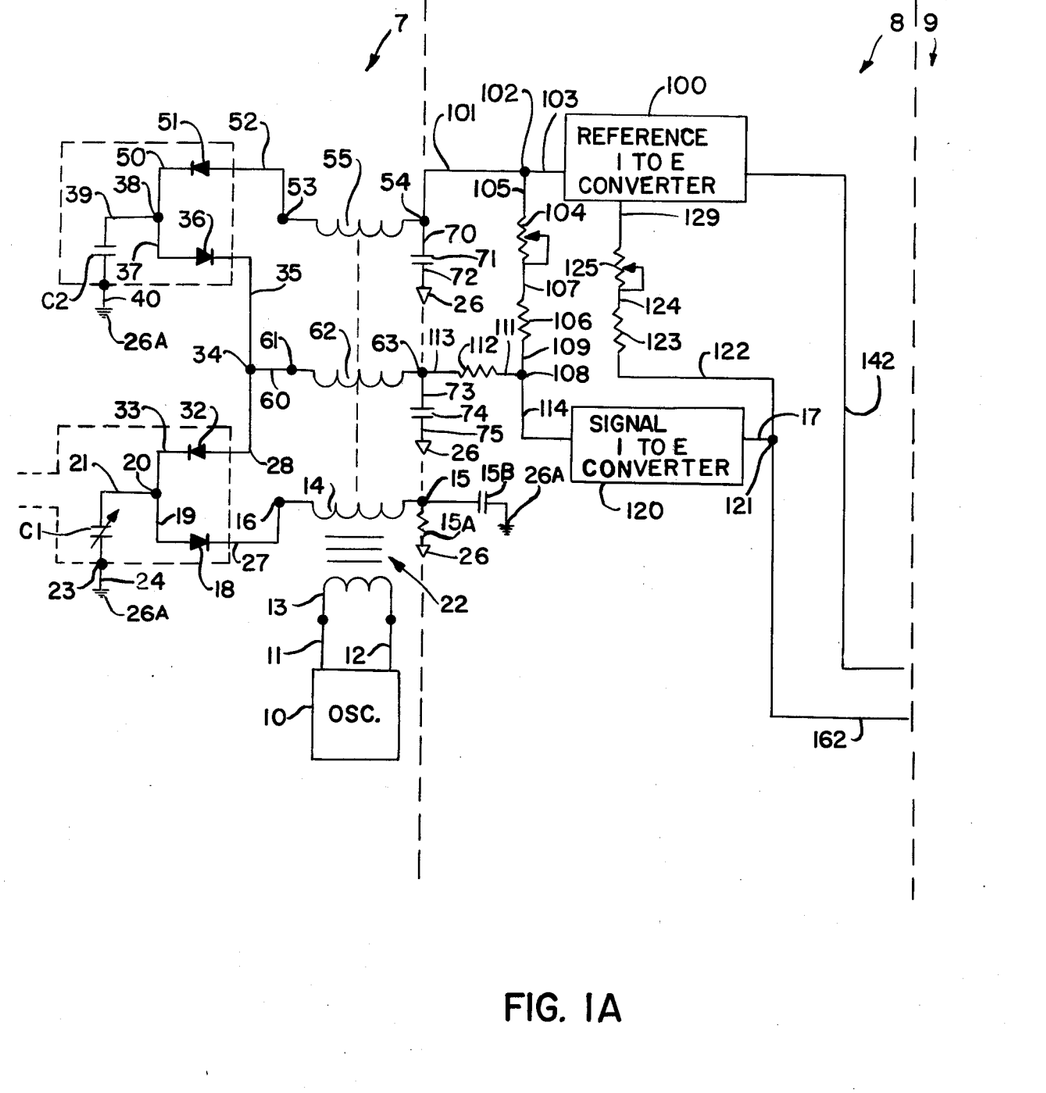
FIGS. 1A and 1B together comprise a block diagram representation of the circuit which provides current supplied to fixed and variable capacitors and the output circuit of the capacitors in a functional relationship to each of the capacitors.
Figure 1B:
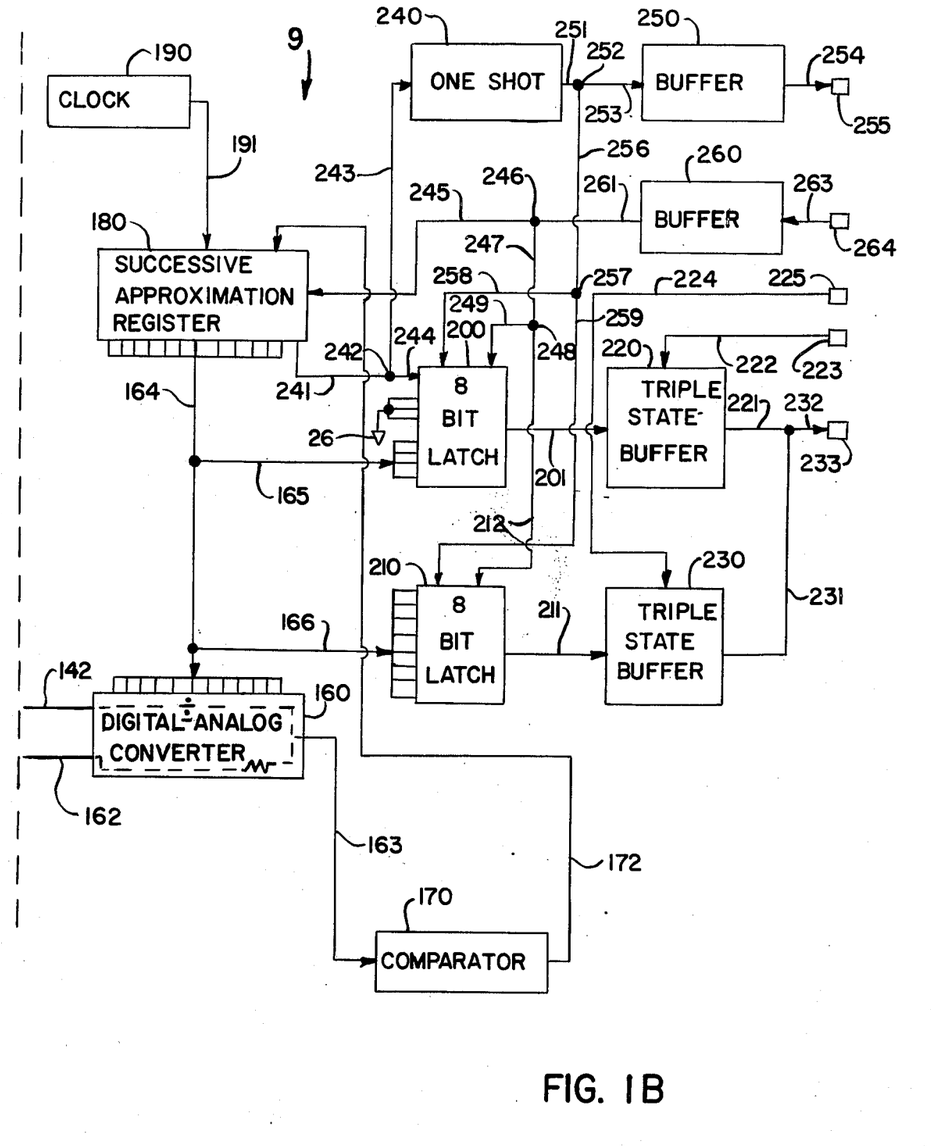

Referring to FIGS. 1A and 1B, the transducer comprises three main portions separated generally by dashed lines and depicted as an input circuit 7, an analog conditioning circuit 8, and an analog to digital output circuit 9.

The input circuit preferred embodiment is shown in a block diagram format in FIG. 1A, wherein C1 represents a capacitive sensor, generally used for sensing pressure, having one active capacitor. Such a pressure sensor may include a diaphram which moves in response to pressure changes and which provides a varying capacitance as the pressure changes. Typical capacitive pressure sensors are generally described in U.S. Pat. No. 3,271,669, issued Sept. 6, 1966, and U.S. Pat. No. 3,619,742, issued Nov. 9, 1971. It is desirable to provide a circuit which gives a binary digital output, which is zeroed and substantially linearly proportional with respect to pressure. The described circuit performs these functions, and due to the functional relationship of capacitor C1 to a reference capacitor C2 there is no need for precise control of the excitation oscillator frequency or amplitude, as long as the current flow through capacitors C1 and C2 is adequate. The current flow must be sufficient to substantially fully charge the respective capacitors by each cycle of the signals from oscillator 10. The circuit also includes digital circuitry for compatability input and output with other related electronic equipment.

OPERATION OF THE INPUT CIRCUIT OF FIG. 1A

Referring to FIG. 1A, input circuit 7 comprises varying capacitor C1 and reference capacitor C2, an oscillator 10, which is powered in a desired manner (the power supply is not shown), and associated rectifying components to provide a reference analog current and a varying analog current (the varying analog current being proportional to the varying capacitance C1), and connecting circuitry.

The output of oscillator 10 is connected to the first end of a primary winding 13 by a line 11, and to the second end of a primary winding 13 by a line 12. A terminal 15 of a first secondary winding 14 is connected through a resistor 15A to circuit ground 26 and is also connected through a capacitor 15B to case ground represented at 26A. A secondary winding terminal 16 is connected by a line 27 to the cathode of a diode 18. The anode of diode 18 is connected to a line 19 which is connected through a circuit node 20 and a line 21 to one side of varying capacitor C1.

The opposite side of capacitor C1 is connected to a line 24 which is connected through a terminal 23 to case ground 26A. The cathode of diode 32 is connected through a line 33 to circuit node 20 and thus to one side of capacitor C1. The anode of diode 32 is connected by a line 28 to a line 60 at a circuit node 34 and thus to one end of a second secondary winding 62 at a terminal 61.

A line 35, connected to circuit node 34, is connected to the cathode of diode 36. The anode of diode 36 is connected by a line 37 to a line 39 at a circuit node 38. Line 39 is connected to one side of reference capacitor C2, and the other side of reference capacitor C2 is connected to case ground 26A by a line 40.

A line 50, which is connected to the cathode of a diode 51 also is connected to lines 39 and 37 at circuit node 38. The anode of diode 51 is connected to line 52 and to a third secondary winding 55 at terminal 53. The opposite end of third secondary winding 55 is a terminal 54 which is connected by a line 70 to one side of a capacitor 71, the other side of which is connected by a line 72 to circuit ground 26.

Second secondary winding 62 has a terminal 63 connected by a line 73 to a capacitor 74, the opposite side of which is connected by line 75 to circuit ground 26. Primary winding 13 and secondary windings 14, 55 and 62 comprise a magnetically coupled, trifilar wound transformer 22.

Oscillator 10 provides repetitive charging and discharging currents or current pulses to capacitor C1 and capacitor C2 through primary winding 13, and first secondary winding 14, second secondary winding 62, and third secondary winding 55. Because of the connections between capacitor C1, diodes 18 and 32, and secondary windings 14 and 62, capacitor C1 charges on a negative conventional current from the oscillator 10. The amount of the charge on capacitor C1 is a function of the frequency and amplitude of the output voltage from the oscillator 10 and the capacitance of C1 which varies as a function of the sensed parameter, usually pressure. Conversely, capacitor C1 discharges on a positive conventional current from oscillator 10 through diode 32. The discharge current from capacitor C1 along with the charging and discharging currents or current pulses from the oscillator 10 combine to form a composite current through second secondary winding 62 at terminal 63, which is a function of the values of capacitance of capacitor C2 minus the capacitance of capacitor C1, that is, C2−C1.

Reference capacitor C2 functions in a similar manner. Because of the connections between capacitor C2, diodes 36 and secondary transformer windings 55 and 62, capacitor C2 charges on a negative conventional current. The amount of the charge on capacitor C2 immediately following the negative conventional current on capacitor C2 is a function of the frequency and amplitude of the output voltage from the oscillator 10. Capacitor C2 discharges on the positive conventional current through diode 51. The discharge current from capacitor C2 along with the charging and discharging currents or current pulses from the oscillator 10 combine to form a composite current through third secondary winding 55 at terminal 54 representative of a function of the capacitance of capacitor C2.

The capacitance values of capacitors C1 and C2 are selected to insure that the value of C2 is equal to or greater than the value of C1 to obtain proper operation.

Capacitor C2 also charges during the positive conventional current through the connections to diode 51. The amount of charge on capacitor C2 immediately following the positive conventional current is a function of the frequency and amplitude of the output voltage from the oscillator 10. This charge from the positive conventional current discharges from C2 during the negative conventional current from the oscillator 10, through diode 36 and second secondary transformer winding 62 where this current is combined with the charging and discharging currents or current pulses from the oscillator 10 and the discharge current from capacitor C1 at terminal 63.

Oscillator 10 required for this circuit is well known to those skilled in the art, in fact, one of the advantages of the circuit is that since the same charging and discharging currents or current pulses are applied to capacitors C1 and C2 the oscillator amplitude and frequency are not critical to the accuracy as long as an adequate level of current is present to fully charge the capacitors during each cycle.

Independence of frequency and amplitude results from the use of the capacitor C2 which is similar electrically to the varying capacitor C1. The application of the same charging and discharging currents or current pulses results in a reference current which is instantaneously present at terminal 54, which as disclosed hereinafter, is combined with the signal current instantaneously present at terminal 63 to provide the value of the sensed parameter.

The charging and discharging currents or current pulses from the oscillator 10 are for practical purposes reduced to negligible value by capacitors 71 and 74 so the reference current at terminal 54 and the signal currents at terminal 63 are substantially free of oscillator wave form ripple. The current from capacitor C1 and current from capacitor C2 are DC and relatively unaffected by capacitors 71 or 74.

OPERATION OF THE ANALOG CONDITIONING CIRCUIT 8 OF FIG. 1A

The analog conditioning circuit 8 of FIG. 1A comprises a reference current to voltage converter 100 for the reference current, a signal current to voltage converter 120 for the signal current, a resistor network to zero the signal current, and a resistor network for linearization of the signal current and connecting circuitry. The purpose of the zero and linearization resistor networks is ultimately to produce a digital output proportional and linear with the sensed parameter, which as stated previously is generally pressure.

A terminal 54 is connected through line 101, circuit node 102 and line 103 to reference current to voltage converter 100. A variable resistor 104 is connected to circuit node 102 through a line 105. Variable resistor 104 is also connected to one end of a resistor 106 ($R_0$) through a line 107. The other end of resistor 106 is connected to line 109 and thus to circuit node 108.

Terminal 63 is connected to circuit node 108 through line 111, resistor 112 and line 113, which are connected in series. A line 114 is connected to circuit node 108 and line 114 is also connected to a signal current to voltage converter 120. The output line 17 of signal current to voltage converter 120 is connected to a circuit node 121. A linearization resistor 123 ($R_L$) is connected to line 122 and thus to circuit node 121 and to line 17. The other end of resistor 123 is connected to a variable resistor 125 by line 124. Variable resistor 125 is connected to voltage converter 100 by a line 129. The output of reference to current voltage converter 100 is carried by line 142.

Reference current instantaneously present at terminal 54 is not constant, but is a function of the amplitude and frequency of the oscillator 10 and the capacitance of capacitor C2. Reference current passes from terminal 54 through lines 101, circuit node 102 and line 103 to the reference current to voltage converter 100. The output of the reference current to voltage converter 100 is reference voltage. It is instantaneously available at circuit node 141 through line 142.

When the circuit is active the signal current is present at circuit node 63. The signal current at this point is a composite of the discharge current from capacitor C1 and the discharge current from capacitor C2. These currents are opposite in sign, that is, the current from capacitor C1 is negative and the current from C2 is positive. Resistor 112 is fixed and in a parallel connection with the resistor 106 and variable resistor 104 with respect to the signal current to voltage 100 converter. Reference current is available to variable resistor 104 and resistor 106 through circuit node 102, line 101 and terminal 54. Again it is important to note that the reference current at terminal 54 is negative with respect to the positive current from capacitor C2 at terminal 63. Thence by selection of variable resistor 104 and resistor 106 effects of the difference in capacitance at zero pressure between capacitor C1 and capacitor C2 on resultant current may be nulled by a portion of the negative current from capacitor C2 at circuit node 108. At this point it should be further noted that the application of the same amplitude and frequency charging and discharging currents by oscillator 10 to capacitor C1 and capacitor C2 allows the combination of the currents from capacitor C1 and capacitor C2 which are of constant relative polarity and proportional amplitude.

The signal current then proceeds through signal current to voltage converter 120 where it is inverted and converted to a signal voltage using conversion methods well known to those skilled in the art and as will be explained in more detail. This signal voltage is available at circuit node 121.

From the voltage available at circuit node 121 a small amount of current in proportion to resistor 123 and variable resistor 125 is present on the line 129. Resistor 123 ($R_L$) is calibrated to each varying capacitor C1. Variable resistor 125 is adjusted based on the digital output of the circuit when compared to a known sensed parameter at varying capacitor C1 to insure linearity throughout the range of the sensed parameter. This current corrects for non-linearity between the varying capacitor C1 and the sensed parameter, generally pressure. The reference voltage comprises a reference signal related to a reference condition of the parameter, as disclosed, zero pressure.

OPERATION OF THE ANALOG TO DIGITAL OUTPUT CIRCUIT 9 OF FIG. 1B

Referring to FIG. 1B, the analog to digital output circuit 9 comprises digital to analog converter 160, comparator 170, a successive approximation register 180, a clock 190, a first eight bit latch 200, a second eight bit latch 210, a first three-state buffer 220, a second three-state buffer 230, a one shot 240, a first buffer 250, second buffer 260, and the connecting circuitry.

One input of digital to analog converter 160 is connected to line 142 and another input is connected to circuit node 121, by line 162. Data input terminals of digital to analog converter 160 are connected to a first data bus 164 which first data bus 164 is also connected to successive approximation register 180. First data bus 164 comprises twelve individual bit lines from the most significant bit, bit 11, through the least significant bit, bit 0. The main portion of first data bus 164 is represented by a single line for convenience except short bit line sections are shown adjacent the register 180 and converter 160. One portion of first data bus 164 from bit 11 through bit 8 is connected to first eight bit latch 200 by second data bus 165. Second data bus 165 comprises a four bit line. The remaining portion of first data bus 164 from bit 7 through the least significant bit, bit 0, is connected to second eight bit latch 210 by a third data bus 166. First eight bit latch 200 is connected by fourth data bus 210 to a first three state buffer 220 (labeled triple state buffer on the drawings). Second eight bit latch 210 is connected by fifth data bus 211 to second three state buffer 230. First three state data buffer 220 is connected by a sixth data bus 221. Second three state buffer 230 is connected to sixth data bus 221 by a seventh data bus 231. Sixth data bus 221 is connected by a eighth data bus 232 to terminal 233. Each data bus carries digital data.

Third data bus 166, fourth data bus 201, fifth data bus 211, sixth data bus 221, seventh data bus 231 and eighth data bus 232 each comprise eight bit lines. Terminal 233 comprises one terminal for each of the eight bit lines from eighth data bus 232. Terminal 233 may be connected to a suitable digital data receiving device for further processing and display. The input of comparator 170 is connected to line 163. Comparator 170 has an output (digital positive voltage or zero voltage) that is connected to a sensing input of a successive approximation register 180, through line 172. Successive approximation register 180 is a standard component as shown in Table I at the end of this specification. It has a clock input connected by a line 191 to a clock 190 for receiving clock control pulses.

The successive approximation register 180 will perform certain functions as will be explained sequentially in a routine in response to signals on line 172 and the digital value on first data bus 164 will be adjusted as a function of signals on line 172. After the routine is completed the successive approximation register 180 will provide a "end of convert signal" along a line 241 which is connected to a circuit node 242 and to a line 243 which is connected to the input of a "one shot" 240. One shot 240 is connected by a line 251 to a circuit node 252 which in turn is connected by a line 253 to the input of a first buffer 250. First buffer 250 is connected by a line 254 to an output terminal 255.

Circuit node 252 is connected to a line 256 which in turn is connected to lines 258 and 259 at circuit node 257. Line 258 in turn is connected to an input terminal of first eight bit latch 200. Line 259 in turn is connected to an input terminal of second eight bit latch 210. Circuit node 242 is connected by a line 244 to a selected input of eight bit latch 200.

The "start" terminal of successive approximation register 180 is connected to the output of buffer 260 by lines 245 and 261 through circuit node 246. Circuit node 246, between lines 245 and 261 is connected by a line 247 to a circuit node 248 and thus to a line 249 and to a "clear" terminal of first eight bit latch 200. Line 212 is connected to the "clear" terminal of second eight bit latch 210, which is also connected to line 247 at circuit node 248. The input of buffer 260 is connected by line 263 to terminal 264. Three unused data inputs of first eight bit latch 200 are connected together to circuit ground 26, as shown on the left side of latch 200 between bus 165 connections and line 244.

The control input of the first three state buffer 220 is connected by a line 222 to terminal 223, and the control input of second three state buffer 230 is connected by a line 224 to a control or input terminal 225.

The analog to digital output circuit 9 comprises analog to digital conversion means.

Digital to analog converter 160 obtains reference voltage from the reference current to voltage converter 100 along line 142 and also obtains signal voltage from the signal current to voltage converter 120 along line 162. Clock 190 operates at a frequency compatible with successive approximation register 180 and digital to analog converter 160 and comparator 170.

The analog to digital circuit 9 is initialized externally by a proper DC pulse at terminal 264 through buffer 260 which clears first eight bit latch 200 and second eight bit latch 210 and starts successive approximation register 180.

Upon initialization and commencing with the next clock pulse from clock 190, successive approximation register 180 begins a routine of operations which will set one switch internal to digital to analog converter 160 on successive clock pulses. The routine begins with the most significant bit (bit 11) and proceeds through to the least significant bit (bit 0).

Starting with most significant bit (bit 11), successive approximation register 180 through first data bus 164 sets the bit 11 switch in digital to analog converter 160. Internally in digital to analog converter 160 the bit 11 switch is connected to a resistor, which is connected to receive the reference voltage, and the resultant current (quotient of reference voltage divided by this resistor) is combined with the current from the signal voltage through a feedback resistor. Again, it is emphasized that reference voltage and signal voltage applied to digital to analog converter 160 are opposite in sign, hence, depending on the resistance in the digital to analog converter 160 selected by successive approximation register 180, the line 163 current from the digital to analog converter 160 to comparator 170 may be positive, negative or zero. When positive current flows to comparator 170 positive voltage is transmitted by the comparator to successive approximation register 180 and setting the register to hold the selected switch and associated resistance in digital to analog converter 160 and, conversely, zero or negative current to comparator 170 produces a zero output voltage from comparator 170 allowing the successive approximation register 180 to eliminate the selected resistance in digital to analog converter 160 during each bit selection cycle of the register 180 routine.

The described cycle is performed on successive clock pulses until successive approximation register 180 has completed its routine through the least significiant bit, bit 0. At which time a 12 bit pattern representing the sensed parameter (data) is present on first data bus 164.

When successive approximation register 180 has completed its routine it transmits a pulse hereinafter "end of convert" along lines 241 and 243 to one shot 240 which provides an output along lines 251 and 253 to buffer 250 and thus to terminal 255 indicating the conversion of the parameter based signal from analog to digital form is complete and hence the data is available.

The end of convert pulse also is provided to first eight bit latch 200, bit 15 position, hereinafter, this pulse is called data ready. One shot 240 toggles first eight bit latch 200 and second eight bit latch 210 along lines 256, 258 and 259 gating the bit pattern from first data bus 164, bit 0 through 7, on third data bus 166 through second eight bit latch 210 along fifth data bus 211 to second three state buffer 230. The bit pattern from first data bus 164, bits 8 through 11, on second data bus 165, along with data ready bit 15 position on first eight bit latch 200 are also gated through fourth data bus 201 to first three state buffer 220. Buffers 220 and 230 may be gated by the presence of the proper DC pulse at terminal 223 and terminal 225, respectively at separate times. The bit patterns of first three state buffer 221 and second three state buffer 230 are available on terminal 233 through sixth data bus 221 seventh data bus 231, and eighth data bus 232 respectively.

The clock rate typically is about 450,000 pulses per second resulting in a clock period of 2.2 microseconds. Each clock pulse duration is, therefore, about 1.1 microseconds. For a 13 bit cycle, i.e. 12 bit data plus 1 cycle for end of convert, this clock rate allows about 33,000-12 bit resolution measurements per second of the sensed parameter, generally pressure. The time from initialization to "end of convert" is approximately 13 bits×2.2 microseconds or 28 microseconds. The speed of response of the digital to analog converter 160 limits the conversion time. The settling time of the analog to digital converter 160 is 500 nanoseconds maximum.

Figure 2:
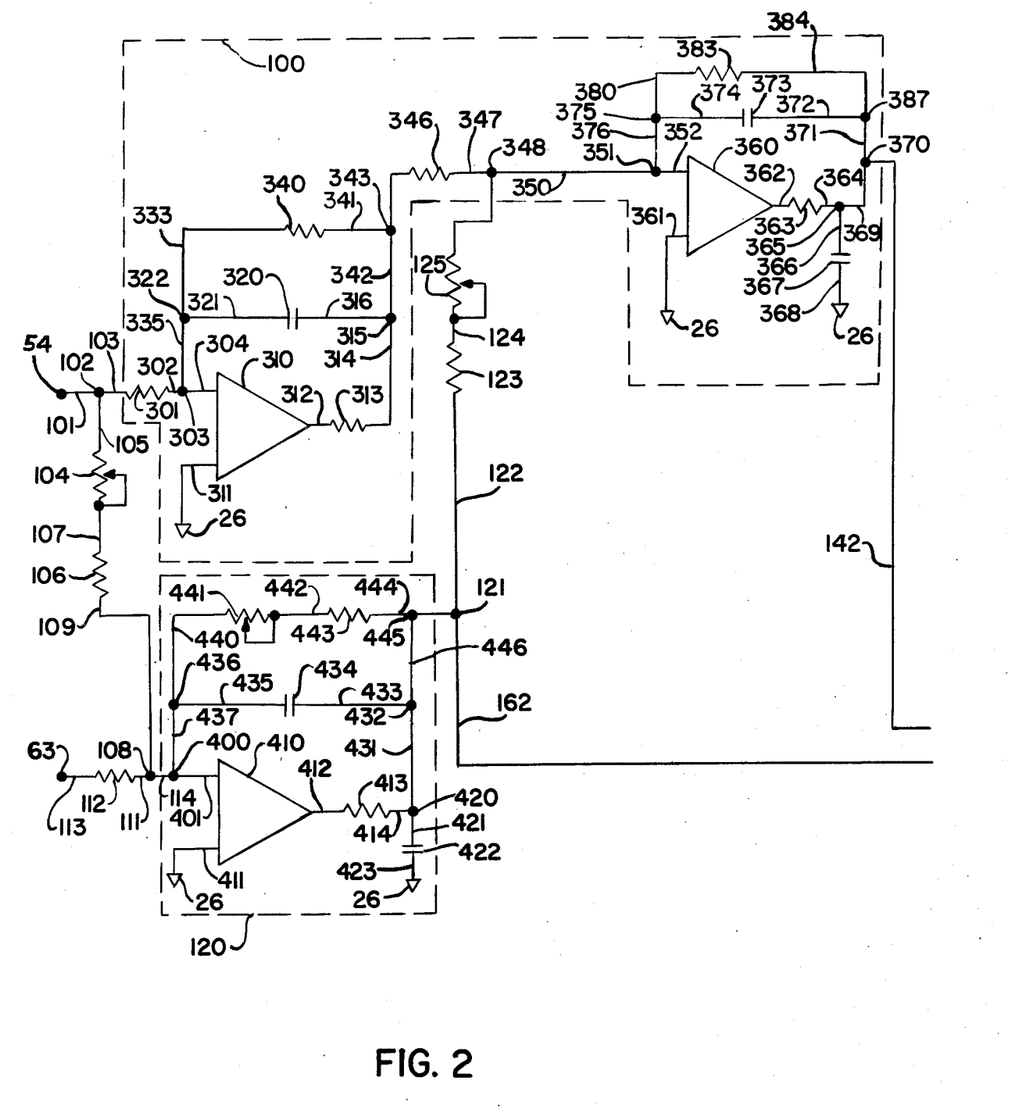
FIG. 2 is a detailed schematic representation of current to voltage converters and connecting circuitry used in the device of FIGS. 1A and 1B.

OPERATION OF REFERENCE CURRENT TO VOLTAGE CONVERTER 100 AND SIGNAL CURRENT TO VOLTAGE CONVERTER 120 OF FIG. 1A AS DISCLOSED IN FIG. 2

Referring to FIG. 1A reference current to voltage converter 100 and signal voltage to current converter 120 are represented on the block diagram in their respective functional relationship with connecting circuitry. FIG. 2 is a detailed schematic representation of reference current to voltage converter 100 and signal current to voltage converter 120, comprising operational amplifiers, resistors, capacitors, variable resistors and connecting circuitry.

In converter 100, as outlined by dotted lines in FIG. 2, terminal 54 of the third secondary winding 55 is shown and line 101 and circuit node 102 are connected thereto. A resistor 301 is connected to circuit node 102 by line 103. Resistor 301 is connected by a line 302 to circuit node 303 which in turn is connected by line 304 to one input of operational amplifier 310. The other input of operational amplifier 310 is connected to circuit ground 26 by line 311. The output of operational amplifier 310 is connected by line 312 to one end of a resistor 313 and the other end of resistor 313 is connected by line 314 to circuit node 315. A capacitor 320 is connected by lines 316 and 321 to circuit nodes 315 and 322. Circuit node 322 is connected by line 335 to circuit node 303 and it is also connected by line 333 to a resistor 340. The other end of resistor 340 is connected by line 341 to circuit node 343. Circuit node 343 is connected by line 342 to circuit node 315 to connect resistor 340 and capacitor 320 in parallel.

Circuit node 343 is also connected by line 345 to a resistor 346. Resistor 346 is connected by line 347 to circuit node 348, which is connected by line 129 to variable resistor 125, which is also shown in FIG. 1A. Circuit node 348 is also connected by line 350 to circuit node 351 which is connected by line 352 to a first input of an operational amplifier 360. A second input of operational amplifier 360 is connected by line 361 to circuit ground 26. The output of operational amplifier 360 is connected by line 362 to a resistor 363. The opposite end of resistor 363 is connected by line 364 to circuit node 365, which is connected by line 366 to a capacitor 367. The opposite side of capacitor 367 is connected by line 368 to circuit ground 26.

Circuit node 365 is connected by line 369 to circuit node 370 and which is connected to line 142 and thus to one input of digital to analog converter 160. Circuit node 370 is connected by line 371 to circuit node 387. Capacitor 373 is connected by lines 372 and 374 to circuit nodes 387 and 375, and circuit node 375 is connected by line 376 to circuit node 351. Circuit node 375 is also connected by line 380 to resistor 383 which is connected by line 384 to circuit node 387. It can be seen therefore that the output of amplifier 360 at circuit node 370 carries the output voltage of converter 100.

In reference to the signal current to voltage converter 120, terminal 63 on the lower left side of FIG. 2

(and also in FIG. 1A) is connected through resistor 112 and lines 111 and 113 to circuit node 108.

Circuit node 108 is connected by line 114 to circuit node 400 and by line 401 to one input of an operational amplifier 410. The other input of operational amplifier 410 is connected by line 411 to circuit ground 26. The output of operational amplifier 410 is connected by line 412 to resistor 413 which is connected by line 414 to circuit node 420. Circuit node 420 is connected by line 421 to capacitor 422, and capacitor 422 is connected by line 423 to circuit ground 26.

Circuit node 420 is also connected by line 431 to circuit node 432. A capacitor 434 is connected by lines 433 and 435 to circuit nodes 432 and 436, respectively. Circuit node 436 is connected by line 437 to circuit node 400 and is also connected by line 440 to variable resistor 441 which is connected by line 442 to resistor 443. Resistor 443 is connected by line 444 to circuit node 445 and also by a line 446 to circuit node 432 so that the series combination of resistor 443 and variable resistors 441 are connected in parallel with capacitor 434. The output of amplifier 410 is carried by lines 431 and 446 to circuit node 445, which is connected to line 17 and thereby to circuit node 121 and to line 162 which forms an input line to digital to analog converter 160.

Signal current to voltage converter 120 performs the functions of summation of current present at circuit node 108 and produces an output voltage at circuit node 445 inverted in sign from the summed current at circuit node 108 and in proportion to currents at circuit node 108 and variable resistor 441 and resistor 443. The current at circuit node 108 is a function of the currents carried in resistor 112, resistor 106, variable resistor 104 and resistor 301.

Capacitor 434 shunts noise and alternating current around operational amplifier 410 to reduce amplification of these undesirable characteristics. Capacitor 421 and resistor 413 on the output of amplifier 401 behave as a filter to reduce noise and alternating current. The filtered output voltage of operational amplifier 410 is provided at circuit node 121 and line 162 through line 17.

Reference current to voltage converter 100 is a cascading amplifier circuit. Operational amplifier 310 is a summator of current available at circuit node 303. Operational amplifier 310 produces an output voltage inverted in sign from current available at circuit node 303, which is in proportion to the current in resistor 301 and feedback resistor 340, variable resistor 104 and resistor 106. Capacitor 320 shunts noise and alternating current around operational amplifier 310 to reduce amplification of undesirable signals. Resistor 313 combines with capacitor 320 to reduce noise and alternating current amplification. The output voltage of operational amplifier 310 is available at resistor 346. Resistor 346 converts the voltage from operational amplifier 310 to a current proportional to the resistance of resistor 346 and to the voltage output signal from amplifier 310. Current from resistor 346 and current from the series combination of resistor 123 and variable resistor 125, (which series combination provides for linearity correction of voltage output from amplifier 410) is present at circuit node 348 and thus to one input of operational amplifier 360.

Operational amplifier 360 sums these currents and produces an output voltage at circuit node 370 inverted in sign from the input current. The voltage at circuit node 370 and thus on line 142 is in proportion to currents in resistor 383, resistor 346, variable resistor 125 and resistor 123. Capacitor 373 shunts noise and alternating current around amplifier 360 to reduce amplification of these undesirable signals. Capacitor 367 and resistor 363 behave as a filter to reduce noise and alternating current. The filtered output voltage of operational amplifier 360 forms the reference voltage utilized by digital to analog converter 160.

Operational amplifier 310, operational amplifier 410 and operational amplifier 360 are selected with frequency response characteristics compatible with the frequency of oscillator 10.

Power supply connections have not been added to the drawings or description to enhance clarity. These power supply connections are well known to those skilled in the art. The power supply used generally will be an isolated power supply for the oscillator, and will provide a voltage compatible with the components.

GENERAL DESCRIPTION

The voltage from C2 which is referred to as a reference voltage is not necessarily a constant value, but in the circuit disclosed both C1 and C2 faithfully follow the excitation level of the oscillator and thus C2 can be used for providing a reference voltage to digital to analog converter 160. The division of the reference voltage by the internal resistance of converter 160 selected by the digital input to the converter is basically ($V_F$/Digital R) where $V_F$ is the reference voltage and R is the resistance in converter 160. Also, the internal feedback resistor of converter 160 (which is shown schematically in FIG. 1B) changes the signal voltage on line 162 to a current for comparison with the quantity ($V_F$/Digital R) which also is a current signal.

The pressure sensor is represented by a dotted line box around capacitor C1 in FIG. 1A, and an inlet for pressure is also represented. The parameter sensed may be any physical parameter or variable including temperature, force, stress or strain or the like. The transducer may also use inductors or resistors which sense the parameter and provide an analog reference voltage and an analog signal voltage as provided herein. These voltages would be converted to digital form as disclosed herein as well.

The major components of the circuits utilized in the circuitry are listed in Table I below. The resistors and capacitors are selected to provide outputs compatible with the sensors and with the other major components used. The eight bit latches 200 and 210 each comprise two four bit latches as listed in Table I.

TABLE I

| COMPONENT | VALUE OR TYPE | MANUFACTURER |
| --- | --- | --- |
| Oscillator — 10 | 2N5114 | Siliconix<br>Santa Clara, California |
| Operational Amplifiers<br>810,360,410 | LF 156H/883 | National Semiconductor Corp.<br>Santa Clara, California |
| Successive Approximation<br>Register — 180 | MM54C905J/883 | National Semiconductor Corp. |
| Digital to Analog<br>Converter — 160 | AD7521 UD/883 | Analog Devices<br>Norwood, Massachusetts |

TABLE I-continued

| COMPONENT | VALUE OR TYPE | MANUFACTURER |
| --- | --- | --- |
| One Shot — 240 | MM54C221J/883 | National Semiconductor Corp. |
| | MM54C14J/88eB | National Semiconductor Corp. |
| First Buffer — 250 | SNC54LS365J | Texas Instruments Incorporated Dallas, Texas |
| Second Buffer — 260 | 54C906J/883B | National Semiconductor Corp. |
| First and Second Three State Buffer — 220–230 | SNC54LS365J (2) per buffer | Texas Instruments Incorporated |
| Clock — 190 | 54C14J | National Semiconductor Corp. |
| First and Second Eight Bit Latch — 200–210 | MC14508BAL | Motorola, Inc. Chicago, Illinois |
| Comparator Operational Amplifier — 170 | LM111JG/883 | National Semiconductor Corp. |
| Diodes — 18,32,36,51 | 1N914 | Texas Instruments Incorporated |

What is claimed is:

1. A transducer having a digital output comprising first means to sense a parameter and provide a first DC analog signal representative of said parameter, analog to digital conversion means, second means coupled to said first means to provide said first DC analog signal to said analog to digital conversion means, third means coupled to said analog to digital conversion means to provide a second reference DC analog signal representative of the first DC analog signal at a reference condition of said parameter, said analog to digital conversion means including fourth means to correlate said first DC analog signal and said second reference DC analog signal and to provide a digital indication of the value of said first DC analog signal with respect to said second reference DC analog signal.

2. The transducer of claim 1 wherein said first and third means comprise capacitive means including a first variable capacitor that changes in value in accordance with the parameter to be measured, and a second reference capacitor, and oscillator means to excite both said reference capacitor and said variable capacitor.

3. The transducer of claim 2 wherein said second means and third means include circuit means coupled to the variable and reference capacitors, respectively, to provide separate currents representative of the capacitance of said reference capacitor and of said variable capacitor with respect to said reference capacitor and including means to convert the separate currents to voltages, and means to connect said circuit means to provide said voltage to said analog to digital conversion means.

4. The transducer of claim 3 wherein said analog to digital conversion means and said fourth means include a digital to analog converter having a data input and being operative to divide the voltage indicative of the capacitance of the reference capacitor by resistance selected as a known function of digital data at the data input of said digital to analog converter to provide a quotient and to combine the quotient and a current representing the capacitance of said variable capacitor to thereby provide a converter output, and means at least partially responsive to the converter output to select said digital data at said data input to achieve a desired relationship of said digital data at said data input and said converter output.

5. The transducer of claim 4 wherein said means to select said digital data at the data input of said digital to analog converter comprises a successive approximation register responsive to a control input signal, comparator means responsive to said converter output to provide a control input signal to said successive approximation register, means to cycle said successive approximation register to sequentially select the digital data provided at the data input of the digital to analog converter as a function of said control signal to provide digital data at the data input of said digital to analog converter representing the capacitance of said variable capacitor.

6. The transducer of claim 5 wherein said fourth means includes means to sample the digital data provided at the data input of the digital to analog converter, when said digital data at said data input represents the capacitance of said variable capacitor.

7. A transducer for sensing a variable parameter and providing a variable analog signal which is a function of the parameter, and having a digital output, including first sensing means to sense a parameter, second means coupled to the sensing means to provide a first DC analog signal varying as a function of said parameter and to provide a second DC reference analog signal representing a reference relationship to the sensing means, a digital to analog converter having a data input, said digital to analog converter providing a converter output which is a function of said first DC analog signal and second DC reference analog signal, said converter including means to combine at least one of said first and second DC analog signals in accordance with a known function of digital data to said data input of said digital to analog converter, means responsive to the converter output signal to adjust the digital data at said data input until a desired relationship exists at said data input, and means to sense the digital data at said data input to provide an indication of the parameter value.

8. The transducer as specified in claim 7 wherein said second means includes a reference element having electrical characteristics similar to the first sensing means, and means coupled to provide electrical excitation to said reference element and first sensing means in a substantially identical electrical relationship.

9. The transducer of claim 7 wherein said first sensing means is a first capacitor which varies in capacitance as a function of the parameter.

10. The transducer of claim 9 wherein said second means includes a second capacitor which does not vary as a function of the parameter being measured, and an oscillator, said second means further including means to connect said first capacitor and said second capacitor to be charged and discharged by said oscillator in a substantially identical electrical relationship during each cycle of said oscillator.

11. The transducer of claim 10 wherein said second means includes means to sense currents from said first and second capacitors which represent the value of the second capacitor and the value of the first capacitor minus the value of the second capacitor.

12. The transducer of claim 12 wherein said second means further includes means to convert the sensed currents to voltages.

13. A transducer for providing a digital output which is a function of a sensed parameter, the transducer comprising:
- first reactive impedance means having a first variable reactive impedance which changes in value in accordance with the sensed parameter;
- second reactive impedance means having a second reference reactive impedance;
- common oscillator means for providing an AC excitation signal to excite both the first and second reactive impedance means;
- means for deriving a first variable DC analog signal which varies as a function of the first reactive impedance;
- means for deriving a second reference DC analog signal from the second reactive impedance means;
- means for providing a DC analog output signal as a function of the first variable DC analog signal, the second reference DC analog signal, and input digital data;
- means for adjusting the input digital data as a function of the DC analog output signal; and
- means for providing a digital output based upon the input digital data.

14. The transducer of claim 13 wherein the means for adjusting the input digital data comprises:
- a successive approximation register responsive to a control input signal for providing the input digital data;
- means for providing the control input signal as a function of the DC analog output signal; and
- means for cycling the successive approximation register to sequentially select the input digital data as a function of the control input signal until the input digital data represents the reactive impedance of the first reactive impedance means.

* * * * *

UNITED STATES PATENT OFFICE
CERTIFICATE OF CORRECTION

Patent No. 4,153,873          Dated  May 8, 1979

Inventor(s)  Earl A. Grindheim

It is certified that error appears in the above-identified patent and that said Letters Patent are hereby corrected as shown below:

Column 12, line 41, (Claim 7, line 15), "to" should be --at--.

Signed and Sealed this

Twenty-fourth Day of July 1979

[SEAL]

Attest:

LUTRELLE F. PARKER

Attesting Officer   Acting Commissioner of Patents and Trademarks